United States Patent [19]

Joyner

[11] Patent Number: 5,364,800

[45] Date of Patent: Nov. 15, 1994

[54] VARYING THE THICKNESS OF THE SURFACE SILICON LAYER IN A SILICON-ON-INSULATOR SUBSTRATE

[75] Inventor: Keith A. Joyner, Richardson, Tex.

[73] Assignee: Texas Instruments Incorporated, Dallas, Tex.

[21] Appl. No.: 82,080

[22] Filed: Jun. 24, 1993

[51] Int. Cl.⁵ .......................................... H01L 21/265
[52] U.S. Cl. ...................................... 437/28; 437/26; 437/62; 437/931; 437/979
[58] Field of Search ................... 437/62, 26, 931, 979, 437/28

[56] References Cited

U.S. PATENT DOCUMENTS

| | | | |
|---|---|---|---|
| 3,707,765 | 1/1973 | Coleman | 437/931 |
| 3,897,274 | 7/1975 | Stehlin et al. | 437/26 |
| 4,975,126 | 12/1990 | Margail et al. | 437/26 |
| 5,196,355 | 3/1993 | Wittkower | 437/26 |
| 5,212,397 | 5/1993 | See et al. | 257/347 |

FOREIGN PATENT DOCUMENTS

| | | | |
|---|---|---|---|
| 0174622 | 8/1986 | Japan | 437/62 |
| 0219562 | 9/1987 | Japan | 437/26 |
| 0283818 | 11/1989 | Japan | 437/26 |
| 2078441 | 1/1982 | United Kingdom | 437/26 |

OTHER PUBLICATIONS

Michael Guerra, "The Status of SIMOX Technology," *Solid State Technology*, Nov., 1990, pp. 75–78.

J. Margail, M. J. Lamure and A. M. Papon, "Defects in SIMOX Structures: Some Process Dependence," *Materials Science and Engineering*, B 12 (1992) pp. 27–36.

*Primary Examiner*—Tom Thomas
*Assistant Examiner*—Trung Dang
*Attorney, Agent, or Firm*—Brian A. Carlson; James C. Kesterson; Richard L. Donaldson

[57] ABSTRACT

A preferred embodiment of this invention is a silicon-on-insulator structure comprising a semiconductor substrate (e.g. Si 36), a buried insulator layer (e.g. $SiO_2$ 34) overlaying the substrate, wherein the buried layer is buried at two or more predetermined depths, and a surface silicon layer (e.g. Si 32) overlaying the buried insulator, wherein the surface silicon layer has two or more predetermined thicknesses. Generally, by patterning and etching a screening material (e.g. $SiO_2$ 30) prior to ion implantation, preselected areas of the substrate with less or no screen material are formed with a thicker surface silicon layer, while other areas with more screen material are formed with a thinner surface silicon layer. The areas of different surface silicon thickness can be used to implement devices with different characteristics based on those thicknesses, within the same integrated circuit. Generally, relatively thinner regions can be used for faster speed devices and relatively thicker regions can be used for greater current carrying capability. The novel technique of depositing, patterning and etching a layer of screening material before implantation can also be used to create a substrate with both bulk and SOI substrate regions, with different portions of a circuit built in each region. Generally, such a substrate can be used to create integrated circuits that have high voltage isolation between different blocks of the circuit. The SOI/bulk substrate can also be used to fabricate integrated circuits which contain low voltage logic and which also regulate large amounts of current at high voltage.

20 Claims, 4 Drawing Sheets

VARYING THE THICKNESS OF THE SURFACE SILICON LAYER IN A SILICON-ON-INSULATOR SUBSTRATE

This invention was made with government support under F33615-89-C-5714 awarded by the United States Air Force. The government has certain rights in this invention.

FIELD OF THE INVENTION

This invention generally relates to integrated circuits, and more particularly to varying the thickness of the surface silicon layer in a silicon-on-insulator substrate.

BACKGROUND OF THE INVENTION

Ion implantation is an alternative method to diffusion for injecting impurities into a semiconductor layer. Ion implantation is typically a process in which ions that have been accelerated by several kilovolts are made to penetrate a solid surface such as silicon, and, unlike the ions in a typical diffusion process, can be made to do this at room temperature. Ion implantation generally produces the maximum concentration of implanted material beneath the surface of the wafer. Because the implanted dopants are generally not in the proper lattice position and are mostly electrically inactive, a high temperature annealing process is often used which repairs crystal damage and electrically activates the dopants.

Implantation of oxygen into silicon is generally a preferred process for building silicon-on-insulator (SOI) substrates which can be used, for example, in very large scale integration (VLSI) devices. This separation by implantation of oxygen (SIMOX) process generally involves three steps:

A) A standard silicon wafer is cleaned in a clean room ambient to substantially remove any received contaminants.

B) Oxygen is implanted under the surface of the wafer at relatively high energy (e.g. $\times 10^{18}/cm^2$ of oxygen atoms at 200 keV).

C) The wafer is annealed at high temperature (e.g. greater than about 1300° C. for 6 hours) to substantially repair implant damage and form the buried oxide layer.

SIMOX wafers are of interest because they can generally be used to provide one or more of the following advantages over bulk silicon wafers:

A) better radiation hardness
B) higher speed performance
C) higher temperature operation
D) lower power devices
E) lower cost process for some applications
F) easier implementation of submicrometer design rules.

Recent improvements in the quality of SIMOX wafers, along with the advent of readily available processing equipment, have helped to stimulate an increased interest in SIMOX technology. "The Status of SIMOX Technology" by Michael A. Guerra, *Solid State Technology*, November 1990, pp. 75–78, discusses SIMOX technology and advances in the field.

SUMMARY OF THE INVENTION

Various methods for reducing defects in SIMOX wafers have been investigated in the past decade. One method, in which the implantation is performed through a protective screen oxide (e.g. $SiO_2$) to reduce contamination and channeling effects, and protect the surface from sputtering, is discussed in "Defects in SIMOX structures: some process dependence" by J. Margail, et al., *Materials Science and Engineering*, Jan. 20, 1992, pp. 27–36. In this method a uniform layer of the screen oxide layer covers the entire wafer surface. A side effect of this method is that as the protective screen oxide layer thickness is increased, the surface silicon layer generally becomes thinner due to partial stopping of the incident ions within the screen layer.

This side effect can be used to one's advantage to create novel, useful and cost effective integrated circuits. In accordance with the present invention, there is provided a process by which a single ion implantation cycle produces a variable thickness surface silicon layer on a single substrate. Generally, by patterning and etching the screen layer prior to implantation, preselected areas of the substrate with less or no screen material are formed with a thicker surface silicon layer, while other areas with more screen material are formed with a thinner surface silicon layer. The areas of different surface silicon thickness can be used to implement devices with different characteristics based on those thicknesses, within the same integrated circuit. For example, the various surface silicon thicknesses would allow the fabrication of fully depleted and non-fully depleted CMOS devices on the same substrate, without selective thinning of specific devices. Generally, relatively thinner regions can be used for faster speed devices and relatively thicker regions can be used for greater current carrying capability. Without this process, different thicknesses of the upper semiconductor layer would generally have to be created by a series of separate process steps following the formation of the buried layer. Another advantage of using screen layers for creating different thicknesses of surface silicon is the reduced chance of moat encroachment. A selective thinning approach would typically be more complex, and would generally create moat encroachment at the edges of the thinned regions.

The novel technique of depositing, patterning and etching a layer of screening material before implantation can also be used to create a substrate with both bulk and SOI substrate regions, with different portions of a circuit built in each region. Generally, such a substrate can be used to create integrated circuits that have high voltage isolation between different blocks of the circuit. The SOI/bulk substrate can also be used to fabricate integrated circuits which contain low voltage logic and which also regulate large amounts of current at high voltage. These types of circuits are often referred to as 'smart power' devices. Large currents can be regulated by transistors built in the bulk region, which would generally dissipate the heat generated better than transistors built in the SOI region. Low voltage logic portions of the circuit can be implemented in the SOI regions of the substrate, which would generally provide higher speed performance than, and good isolation from, the portions of the circuit built in the bulk regions. Another advantage of this patterned SOI method of creating an SOI/bulk substrate is that the structure produced would generally have a small vertical displacement (or step) between the SOI and the bulk portions of the circuit. Generally, in the prior art, creating an SOI/bulk substrate by the method of etching away the surface silicon and the buried insulator in an area to gain access to the bulk silicon would result in a large vertical displacement between the SOI and the exposed bulk. This would make integrated circuit fabrication, which generally requires a high degree of planarization, much more difficult or impossible.

One embodiment of this invention is a silicon-on-insulator structure comprising a silicon substrate, a buried insulator layer overlaying the substrate, wherein the buried layer is buried at two or more predetermined depths, and a surface silicon layer overlaying the buried insulator, wherein the surface silicon layer has two or more predetermined thicknesses.

A method of forming an embodiment of this invention comprises the steps of forming a screen layer having a predetermined pattern on a top surface of a silicon substrate, thereby creating one or more exposed regions of the silicon substrate and one or more unexposed regions of the silicon substrate, implanting ions into the exposed and unexposed regions of the silicon substrate, wherein the ions implanted into the unexposed regions travel through and are impeded by the screen layer, thereby causing the ions implanted in the unexposed regions to be closer to the top surface of the silicon substrate than the ions implanted in the exposed regions, annealing the substrate to form a substantially well-defined buffed insulator layer overlaying the silicon substrate, and to form a surface silicon layer overlaying the buried insulator layer, wherein the portion of the surface silicon layer formed under the screen layer is thinner than the portion of the surface silicon layer formed in the exposed region of the silicon substrate, removing any remaining portions of the screen layer, etching the surface silicon layer to substantially expose the portion of the buried insulator layer underlying the thinner portion of the surface silicon layer, and etching the exposed buried insulator to substantially expose the portion of the silicon substrate underlying the exposed buried insulator, whereby both bulk silicon surface regions and SOI surface regions are formed on the same substrate.

Another method of forming an embodiment of this invention comprises the steps of forming a screen layer having a uniform thickness on a top surface of a silicon substrate, etching the screen layer to form areas with a relatively thicker screen and areas with a relatively thinner screen, implanting ions into the silicon substrate, wherein the ions are implanted to a lesser depth under the thicker screen areas and to a greater depth in the thinner screen areas, annealing the substrate to form a substantially well-defined buried insulator layer overlaying the silicon substrate, and to form a surface silicon layer overlaying the buried insulator layer, wherein the portion of the surface silicon layer formed under the thicker screen areas is thinner than the portion of the surface silicon layer formed under the thinner screen areas, and removing any remaining portions of the screen layer, whereby the different surface silicon thicknesses can be used to implement microelectronic devices with varying characteristics based on those thicknesses.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1:
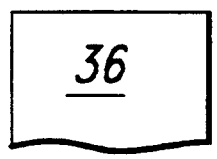
FIGS. 1-6 are cross-sectional views of a method for forming both silicon-on-insulator and bulk silicon areas on the same substrate.
Figure 4:
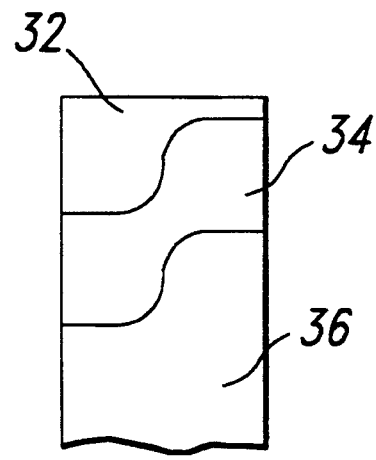
Figure 2:
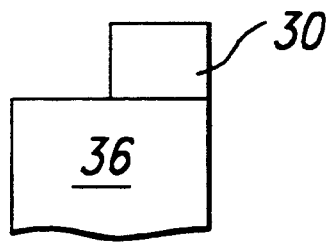
Figure 5:
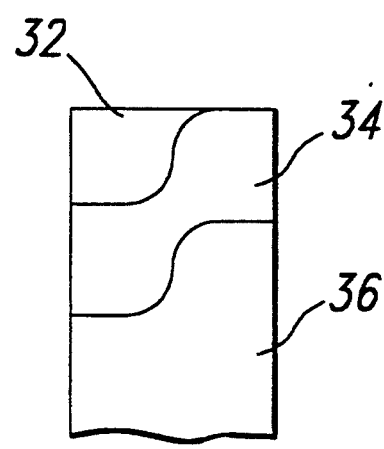
Figure 3:
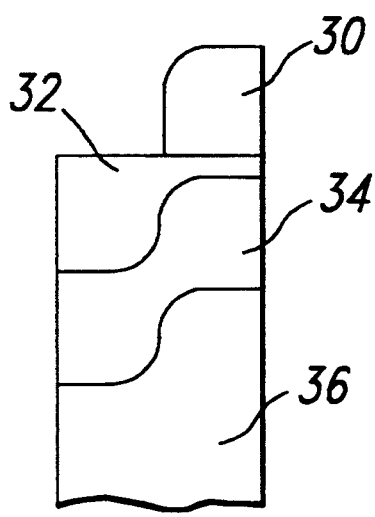
Figure 6:
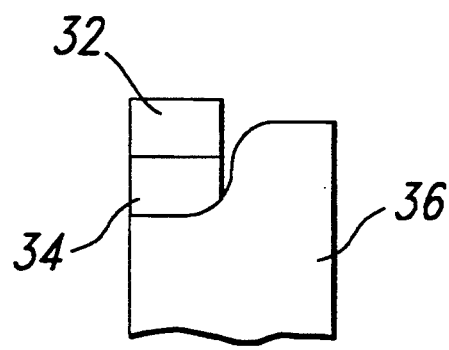

With reference to FIGS. 1-6, there is shown a method of forming a preferred embodiment of this invention, a substrate comprising both an SOI region and a bulk region for device implementation. FIG. 1 illustrates a standard bulk silicon substrate 36. FIG. 2 illustrates a patterned and etched $SiO_2$ screen layer 30 overlaying a portion of the silicon substrate 36. FIG. 3 illustrates the buried oxide layer 34 and the associated surface silicon layer 32 that are formed after oxygen ion implantation. The $SiO_2$ screen 30 impedes the progress of the ions traveling through it, so the buried $SiO_2$ layer 34 is closer to the surface under the screen 30, which has the effect of making the surface silicon layer 32 thinner under the screen 30. Generally, during the implantation process some of the screen layer 30 is sputtered off. If the screen layer is thin enough (e.g. less than about 150 nm), then the entire layer may be sputtered off. FIG. 4 illustrates the structure after annealing and after any remaining $SiO_2$ screen has been removed. With reference to FIG. 5, dry or wet etching to remove the top level of the surface silicon 32 exposes the portion of the buried $SiO_2$ layer 34 corresponding to and underlying the thinner surface silicon region. With reference to FIG. 6, the exposed portion of the buried $SiO_2$ layer 34 is etched away down to the silicon substrate 36, producing a structure with both exposed bulk and SOI substrate regions. With this method, neither the surface silicon etch nor the buried $SiO_2$ etch require patterning. Also, the overall surface of the structure is closer to being planar than prior art structures. In the prior art, part of the surface silicon layer and the corresponding portion of the buried $SiO_2$ layer are etched off of a completed SOI wafer. The exposed bulk region of the wafer would be recessed a substantial distance below the surface silicon layer in the prior an structure.

Figure 7:
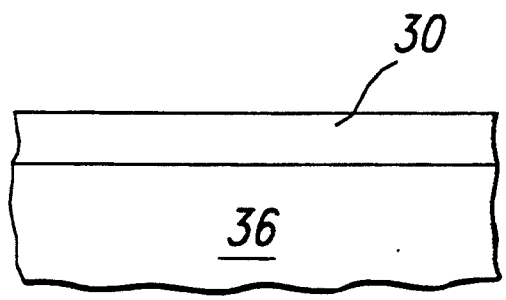
FIGS. 7-10 are cross-sectional views of a method for forming a tapered surface silicon layer on a silicon-on-insulator substrate.
Figure 8:
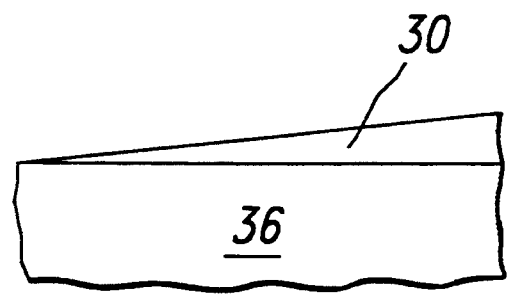
Figure 9:
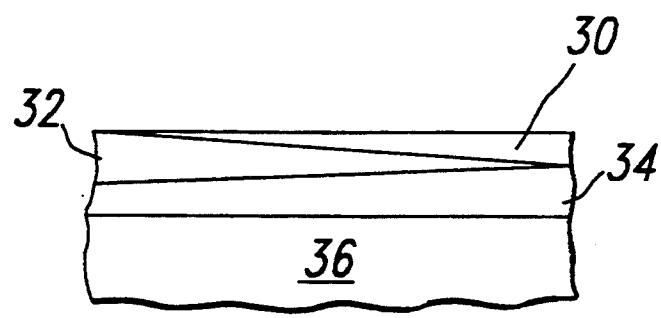
Figure 10:
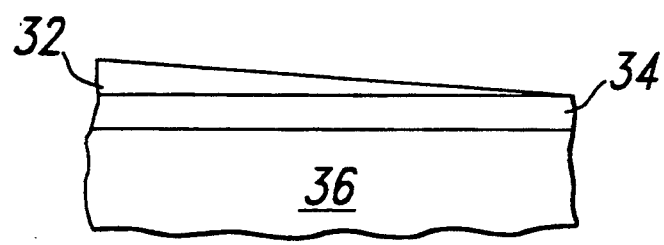

In an alternate embodiment, with reference to FIGS. 7-10, there is shown a method of forming an SOI substrate with a tapered surface silicon layer. FIG. 7 illustrates a uniform $SiO_2$ screen layer 30 formed on the surface of a silicon substrate 36. With reference to FIG. 8, a taper etch process is used to remove varying amounts of the $SiO_2$ screen 30 from the surface of the wafer. Typically, a tapered etch can be done by slowly lowering a tilted wafer into an etchant, or by slowly raising the level of etchant in a tank containing a tilted wafer. The $SiO_2$ screen 30 can vary from full thickness on one side of the wafer to zero thickness on the other side of the wafer. FIG. 9 illustrates the buried oxide layer 34 and the associated surface silicon layer 32 that are formed after oxygen ion implantation. The varying thickness of the $SiO_2$ screen 30 causes the depth of the buried $SiO_2$ layer 34 to vary across the wafer, which has the effect of making the surface silicon layer 32 thickness vary across the wafer. FIG. 10 illustrates the structure after annealing and after any remaining $SiO_2$ screen has been removed. Generally, the varying thickness of the surface silicon layer 32 allows the implementation of devices with characteristics that differ depending on their location on the surface silicon 32.

Figure 11:
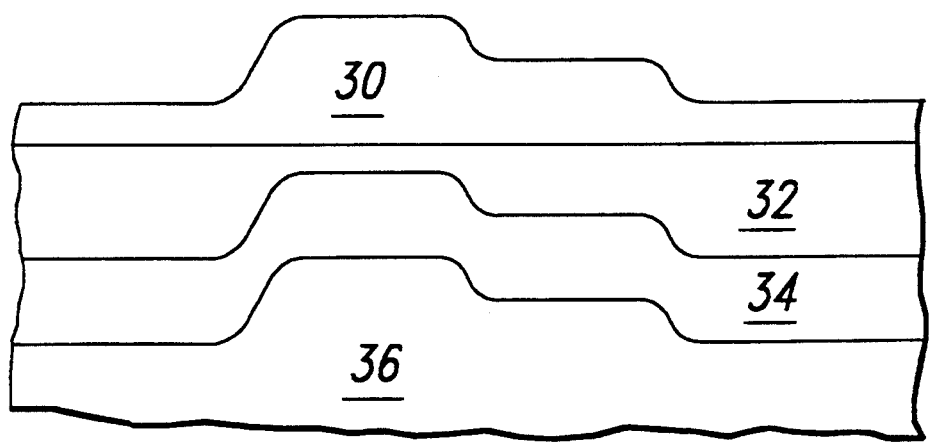
FIG. 11 is a cross-sectional view of a silicon-on-insulator substrate with a screen layer having various levels of different thickness.
Figure 12:
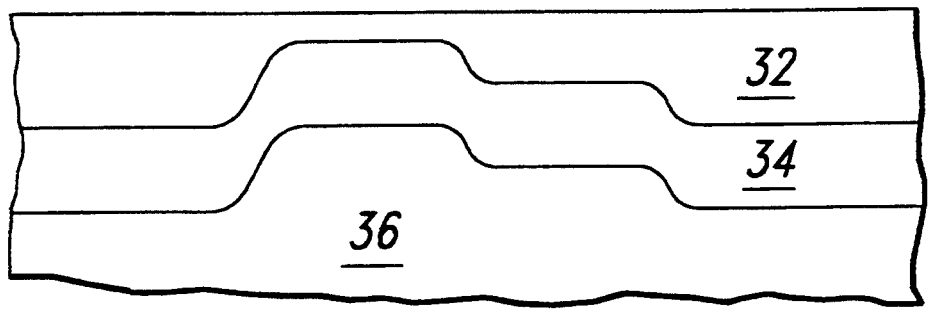
FIG. 12 is a cross-sectional view of a silicon-on-insulator substrate with areas of different surface silicon thickness.

In another alternate embodiment, FIG. 11 illustrates an SOI substrate with a screen layer 30 that has been etched to various levels with different thicknesses. By using methods similar to those discussed in the previous embodiments, the buried $SiO_2$ layer 34 and surface silicon layer 32 are formed below the screen layer 30. FIG. 12 illustrates the SOI substrate after the screen layer has been removed. Again, the areas of different surface silicon thickness can be used to produce devices with different characteristics.

Figure 13:
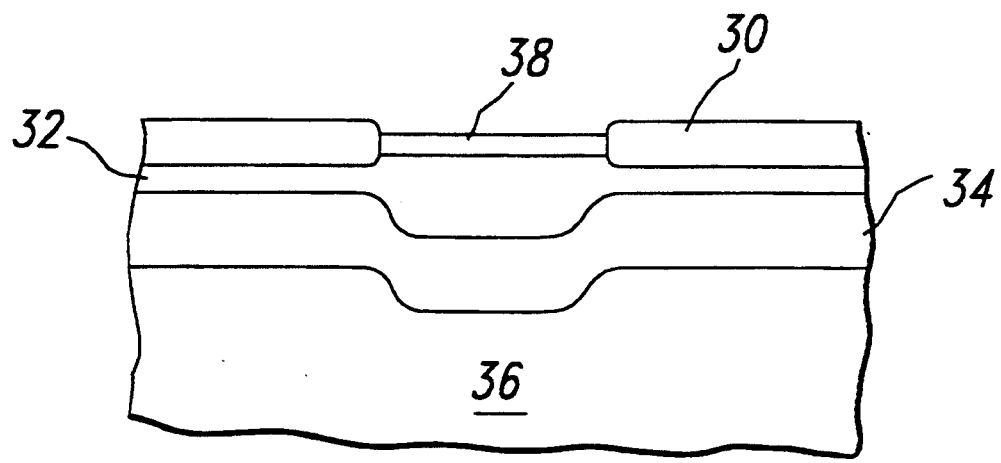
FIG. 13 is a cross-sectional view of a silicon-on-insulator substrate with a screen layer having various materials of different thickness.

In another alternate embodiment, FIG. 13 illustrates an SOI substrate that uses two different materials as a screen. Both $Si_3N_4$ 38 and $SiO_2$ 30 have been formed on the substrate, which is then processed as discussed hereinabove to form the buried $SiO_2$ layer 34 and the surface silicon layer 32. After annealing, the screen materials are removed to prepare the substrate for further processing. Generally, when using more than one material for the screen, relative ion implantation depth depends on more than just the relative height of the screen material. For example, relative material density will also influence ion penetration. As used herein, the terms "thick", "thicker", "thin", and "thinner", when used in comparing more than one material functioning as a screen, refer to a material's relative ability to reduce the penetration of ions into the substrate. "Thicker" materials impede the ions more than "thinner" materials. Also, as used herein, the terms "thin" and "thinner", when used in reference to screen materials, include the case in which there is no screen material present. Areas with no screen material would generally provide maximum ion penetration relative to areas with screen material. In general, all material thicknesses are chosen to allow at least some ion penetration into the substrate.

Figure 14:
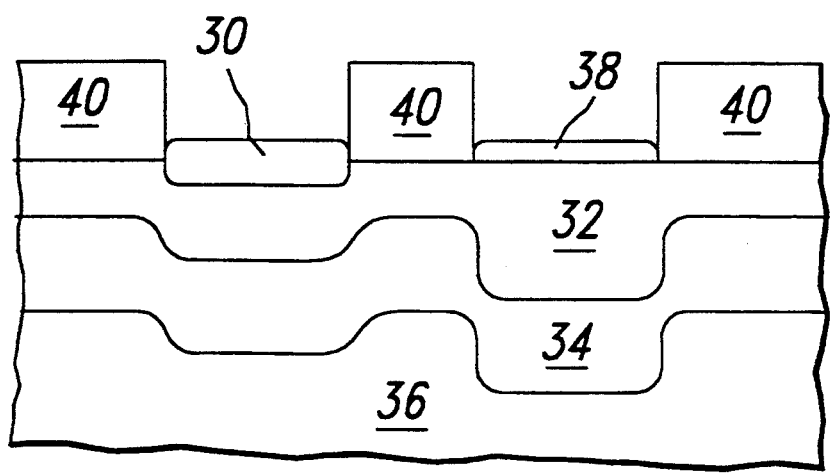
FIG. 14 is a cross-sectional view of a silicon-on-insulator substrate with a screen layer having various materials of different thickness.

In yet another alternate embodiment, FIG. 14 also illustrates an SOI substrate that uses more than one material as a screen. Photoresist 40 has been deposited and etched, and $Si_3N_a$ 38 and $SiO_2$ 30 have been formed on the substrate, which is then processed as discussed hereinabove to form the buffed $SiO_2$ layer 34 and the surface silicon layer 32. In addition to areas shielded by screen material, areas with no screen layer (e.g. as illustrated in FIG. 3) may also be used. After annealing the screen materials are removed to prepare the substrate for further processing.

The sole table, below, provides an overview of some embodiments and the drawings.

TABLE

| Drawing Element | Preferred or Specific Examples | Generic Term | Other Alternate Examples |
|---|---|---|---|
| 30 | $SiO_2$ | Screen layer | Other shielding materials (e.g. $Si_3N_4$, photoresist, Si) Combinations of above mentioned materials (e.g. $SiO_2$/photoresist, $SiO_2$/$Si_3N_4$) |
| 32 | Si | Surface layer | Other semiconductors |
| 34 | $SiO_2$ | Buried insulator | Other insulators (e.g. $Si_3N_4$) |
| 36 | Si | Substrate | Other semiconductors |
| 38 | $Si_3N_4$ | 2nd screen material | Materials listed under Drawing Element 30 above |
| 40 | Photoresist | 3rd screen material | Materials listed under Drawing Element 30 above |

A few preferred embodiments have been described in detail hereinabove. It is to be understood that the scope of the invention also comprehends embodiments different from those described, yet within the scope of the claims. With reference to the structures described, electrical connections to such structures can be ohmic, rectifying, capacitive, direct or indirect, via intervening circuits or otherwise. Implementation is contemplated in discrete components or fully integrated circuits. In general the preferred or specific examples are preferred over the other alternate examples.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a modified semiconductor substrate, said method comprising:
   A. forming a screen layer having a pattern on a top surface of a silicon substrate, thereby creating one or more exposed regions of said silicon substrate and one or more unexposed regions of said silicon substrate;
   B. implanting ions into said exposed and unexposed regions of said silicon substrate, wherein said ions implanted into said unexposed regions travel through and are impeded by said screen layer, thereby causing said ions implanted in said unexposed regions to be closer to said top surface of said silicon substrate than said ions implanted in said exposed regions;
   C. annealing said substrate to form a substantially well-defined buried insulator layer overlaying said silicon substrate, and to form a surface silicon layer overlaying said buried insulator layer, wherein the portion of said surface silicon layer formed under said screen layer is thinner than the portion of said surface silicon layer formed in said exposed region of said silicon substrate;
   D. removing any remaining portions of said screen layer;
   E. etching said surface silicon layer to substantially expose the portion of said buried insulator layer underlying said thinner portion of said surface silicon layer; and
   F. etching said exposed buried insulator to substantially expose the portion of said silicon substrate underlying said exposed buried insulator, whereby both bulk silicon surface regions and SOI surface regions are formed on the same substrate.

2. The method according to claim 1, wherein said ions are oxygen ions.

3. The method according to claim 1, wherein said screen layer is substantially sputtered off during ion implantation, and is not removed after said substrate anneal.

4. The method according to claim 1, said method further comprising etching said screen layer to more than one thickness before said ion implantation, whereby said surface silicon layer is formed with more than one thickness.

5. The method according to claim 1, said method further comprising forming one or more first active microelectronic devices on said bulk silicon surface regions and forming one or more second active microelectronic devices on said SOI surface regions.

6. The method according to claim 1, wherein said bulk silicon surface regions and said SOI surface regions are substantially planar.

7. The method according to claim 1, wherein said portion of said surface silicon layer formed under said screen layer is substantially thinner than said portion of said surface silicon layer formed in said exposed region of said silicon substrate.

8. The method according to claim 1, wherein said screen layer is selected from the group consisting of: $SiO_2$, $Si_3N_4$, Si, photoresist, and combinations thereof.

9. The method according to claim 1, wherein said buried insulator layer is selected from the group consisting of: $SiO_2$, $Si_3N_4$, and combinations thereof.

10. A method of forming a modified semiconductor substrate, said method comprising:
   A. forming a screen layer on a top surface of a silicon substrate, said screen layer comprising two or more screen materials;
   B. modifying said screen layer to form areas with thicker screens and areas with thinner screens;
   C. implanting ions into said silicon substrate, wherein said ions are implanted to a lesser depth under said thicker screen areas and to a greater depth in said thinner screen areas;
   D. annealing said substrate to form a substantially well-defined buffed insulator layer overlaying said silicon substrate, and to form a surface silicon layer overlaying said buried insulator layer, wherein the portion of said surface silicon layer formed under said thicker screen areas is thinner than the portion of said surface silicon layer formed under said thinner screen areas; and
   E. removing any remaining portions of said screen layer, whereby the different surface silicon thicknesses can be used to implement microelectronic devices with varying characteristics based on those thicknesses.

11. The method according to claim 10, wherein said screen layer is modified by etching said screen layer to levels of varying depth, whereby said surface silicon layer is formed with levels of varying thickness.

12. The method according to claim 10, said method further comprising forming one or more first active microelectronic devices on said thinner portion of said surface silicon layer and forming one or more second active microelectronic devices on said thicker portion of said surface silicon layer.

13. The method according to claim 10, wherein said thicker screens comprise a first screen material and said thinner screens comprise a second screen material, wherein said second screen material is different from said first screen material.

14. The method according to claim 10, wherein said ions are oxygen ions.

15. The method according to claim 10, wherein said screen layer is substantially sputtered off during ion implantation, and is not removed after said substrate anneal.

16. The method according to claim 10, wherein said screen layer is selected from the group consisting of: $SiO_2$, $Si_3N_4$, Si, photoresist, and combinations thereof.

17. The method according to claim 10, wherein said buried insulator layer is selected from the group consisting of: $SiO_2$, $Si_3N_4$, and combinations thereof.

18. A method of forming a modified semiconductor substrate, said method comprising:
   A. forming a screen layer on a top surface of a silicon substrate;
   B. modifying said screen layer using a taper etch across said substrate, thereby forming areas with thicker screens and areas with thinner screens;
   C. implanting ions into said silicon substrate, wherein said ions are implanted to a lessor depth under said thicker screen areas and to a greater depth in said thinner screen areas;
   D. annealing said substrate to form a substantially well-defined buried insulator layer overlaying said silicon substrate, and to form a surface silicon layer overlaying said buried insulator layer, wherein said surface silicon layer has a continuously tapered thickness substantially entirely across said substrate; and
   E. removing any remaining portions of said screen layer, whereby the different surface silicon thicknesses can be used to implement microelectronic devices with varying characteristics based on those thicknesses.

19. The method according to claim 18, wherein said screen layer is selected from the group consisting of: $SiO_2$, $Si_3N_4$, Si, photoresist, and combinations thereof.

20. The method according to claim 18, wherein said buried insulator layer is selected from the group consisting of: $SiO_2$, $Si_3N_4$, and combinations thereof.

* * * * *